United States Patent
Williams (10) Patent No.: US 8,593,133 B2
(45) Date of Patent: Nov. 26, 2013

(54) CURRENT MEASURING SYSTEMS AND METHODS OF ASSEMBLING THE SAME

(75) Inventor: Craig B. Williams, Louisville, KY (US)

(73) Assignee: General Electric Company, Schenectady, NY (US)

( * ) Notice: Subject to any disclaimer, the term of this patent is extended or adjusted under 35 U.S.C. 154(b) by 323 days.

(21) Appl. No.: 12/981,149

(22) Filed: Dec. 29, 2010

(65) Prior Publication Data
US 2012/0169328 A1    Jul. 5, 2012

(51) Int. Cl.
*G01R 19/20* (2006.01)

(52) U.S. Cl.
USPC .................................. 324/117 R; 324/117 H (58) Field of Classification Search
None
See application file for complete search history.

(56) References Cited

U.S. PATENT DOCUMENTS

| | | | |
|---|---|---|---|
| 5,473,244 A * | 12/1995 | Libove et al. | 324/126 |
| 5,615,075 A | 3/1997 | Kim | |
| 5,767,668 A * | 6/1998 | Durand | 324/117 R |
| 6,058,036 A * | 5/2000 | Endo et al. | 363/98 |
| 6,108,185 A | 8/2000 | Kim et al. | |
| 6,611,411 B2 | 8/2003 | Williams et al. | |
| 6,774,664 B2 * | 8/2004 | Godbersen | 324/545 |
| 6,836,396 B1 * | 12/2004 | Tignor et al. | 361/93.3 |
| 7,369,389 B2 | 5/2008 | Vicente et al. | |
| 7,560,895 B2 * | 7/2009 | Arnet | 318/778 |
| 7,898,203 B2 * | 3/2011 | Davis et al. | 318/490 |
| 8,125,214 B1 * | 2/2012 | Steingart et al. | 324/117 H |

OTHER PUBLICATIONS

"Electronic Trip Unit for SB Encased Systems Breakers" Information and Instruction Guide web page; www.sea.siemens.com; 2000; 39 pages; Siemens Energy & Automation, Inc., Alpharetta, GA.

* cited by examiner

*Primary Examiner* — Richard Isla Rodas
(74) *Attorney, Agent, or Firm* — General Electric Company (57) ABSTRACT

A current measuring system for measuring a current through a conductor is described. The system includes a first sensor configured to measure a first magnetic flux and to generate a first signal proportional to the first magnetic flux. The system also includes a second sensor configured to measure a second magnetic flux and to provide a second signal proportional to the second magnetic flux, the second sensor having a higher sensitivity to stray magnetic fields than the first sensor. The system also includes a processor coupled to the first sensor and the second sensor and configured to receive the first signal and the second signal. The processor is further configured to determine a presence of a stray magnetic field by comparing the first signal and the second signal.

10 Claims, 7 Drawing Sheets

CURRENT MEASURING SYSTEMS AND METHODS OF ASSEMBLING THE SAME

BACKGROUND OF THE INVENTION

The field of the disclosure relates generally to current measuring systems and methods of assembling the same, and more specifically, to a current measuring system that includes multiple magnetic field sensors.

Circuit breakers currently used to protect, for example, a residential or commercial environment, generally detect the presence of overcurrent conditions and release an operating mechanism to separate the circuit breaker contacts. Current flow may be monitored by positioning a shunt resistor in the current path and measuring a voltage drop across the shunt resistor. However, undesirable heat is generated by the shunt resistor when current is monitored in this manner. A sense transformer may be used to detect a level of alternating current (AC) within a conductor without positioning a shunt resistor in the current path. Solid state magnetic field sensors, for example, a Hall effect device or a giant magnetoresistance (GMR) device, may be used to measure AC or direct current (DC) flowing through a conductor without positioning a shunt resistor in the current path. Hall effect devices measure a magnetic flux and output a voltage that corresponds to a level of magnetic flux measured. However, such sensors are subject to error if they are exposed to stray magnetic fields from the surrounding environment. A Hall effect device cannot distinguish between the magnetic field produced by the current in the conductor and a stray magnetic field. The Hall effect device merely measures a level of magnetic flux.

Magnetic fields from adjacent devices create noise and prevent accurate measurement of current through the conductor. This can be a significant problem for circuit breakers when they are used in applications where they are in close proximity to multiple devices that can see high in-rush or short circuit currents. Although these high currents are typically transient, the high currents create large magnetic fields. For example, a multi-phase circuit may include multiple circuit breakers, each circuit breaker configured to disconnect a phase if the current in that phase exceeds an overcurrent level. In the multi-phase circuit, an overcurrent occurrence within one phase could generate enough magnetic flux to cause a circuit breaker in an immediately adjacent phase to provide a false indication of an overcurrent occurrence in the adjacent phase.

Typically, distance and magnetic shielding have been used to reduce effects of stray magnetic fields on a Hall effect device positioned to measure a current level within a conductor. If not shielded, current in an adjacent pole may cause the Hall effect device's output to correspond to a current level that is greater than the actual current within the conductor (i.e., the Hall effect device does not provide and accurate measurement of the actual current within the conductor). This false signal may be greater than the circuit breaker's nominal setting which would result in tripping of the circuit breaker. Tripping of the circuit breaker when the actual current within the conductor is below an overcurrent level is referred to herein as nuisance tripping. For example, a magnetic core may be used to concentrate the conductor's magnetic field and shield the sensor from stray magnetic fields. A magnetic field shielding material draws magnetic flux to keep it away from the sensor. Furthermore, increasing a distance between the sensor and sources of stray magnetic fields reduces the effect the stray magnetic fields will have on the sensor.

For systems with potential for large magnetic fields, it may not be possible to provide enough shielding or distance to ensure a good signal to noise ratio (i.e., low noise from adjacent devices). Size constraints in some circuit breaker applications, for example, a molded case circuit breaker, limit the effectiveness of shielding and distance due to the close spacing of the circuit breakers. Even when size is not a constraint, material for shielding adds cost to the circuit breaker.

BRIEF DESCRIPTION OF THE INVENTION

In one aspect, a current measuring system for measuring a current through a conductor is provided. The system includes a first sensor configured to measure a first magnetic flux and to generate a first signal proportional to the first magnetic flux. The system also includes a second sensor configured to measure a second magnetic flux and to provide a second signal proportional to the second magnetic flux, the second sensor having a higher sensitivity to stray magnetic fields than the first sensor. The system also includes a processor coupled to the first sensor and the second sensor and configured to receive the first signal and the second signal. The processor is further configured to determine a presence of a stray magnetic field by comparing the first signal and the second signal.

In another aspect, a circuit protection device positioned between a power source and a load is provided. At least one conductor couples the power source to the load. The device includes a first sensor configured to measure a first magnetic flux and to provide a first signal proportional to the first magnetic flux. The device also includes a second sensor configured to measure a second magnetic flux and to provide a second signal proportional to the second magnetic flux. The second sensor has a higher sensitivity to stray magnetic fields than the first sensor. The device also includes a processor coupled to the first sensor and the second sensor and configured to receive the first signal and the second signal. The processor is further configured to compare the first signal and the second signal to determine a presence of a stray magnetic field. The processor is further configured to generate a trip signal. The device also includes a trip device coupled to the processor and configured to disconnect the power source and from the load in response to the trip signal.

In yet another aspect, a method for assembling a circuit protection device positioned between a power source and a load is provided. At least one conductor couples the power source to the load. The method includes providing a first magnetic field sensor for measuring a first magnetic flux and providing a second magnetic field sensor for measuring a second magnetic flux. The second magnetic field sensor has a higher sensitivity to stray magnetic fields than the first magnetic field sensor. The method also includes configuring a processor to generate a trip signal based at least partially on a comparison of the first magnetic flux and the second magnetic flux.

DETAILED DESCRIPTION OF THE INVENTION

The methods, systems, and apparatus described herein facilitate measuring current in a conductor, and for example, using the current measurement to operate a circuit protection device. An example of a circuit protection device is a circuit breaker. Although described herein with respect to a circuit protection device, the methods, systems, and apparatus described herein may also be included within, or used in conjunction with, other types of systems, for example, but not limited to, electric motors and control systems, and electric vehicles. The methods, systems, and apparatus described herein include a plurality of magnetic field sensors and a processor configured to identify the presence of a stray magnetic field. Furthermore, the processor may distinguish between a portion of the measured magnetic flux generated by current flowing through the conductor and a portion of the measured magnetic flux associated with stray magnetic fields.

Technical effects of the methods, systems, and apparatus described herein include at least one of: (a) measuring a first magnetic flux; (b) measuring a second magnetic flux; and (c) determining a presence of stray magnetic fields by comparing the first magnetic flux and the second magnetic flux.

Figure 1:
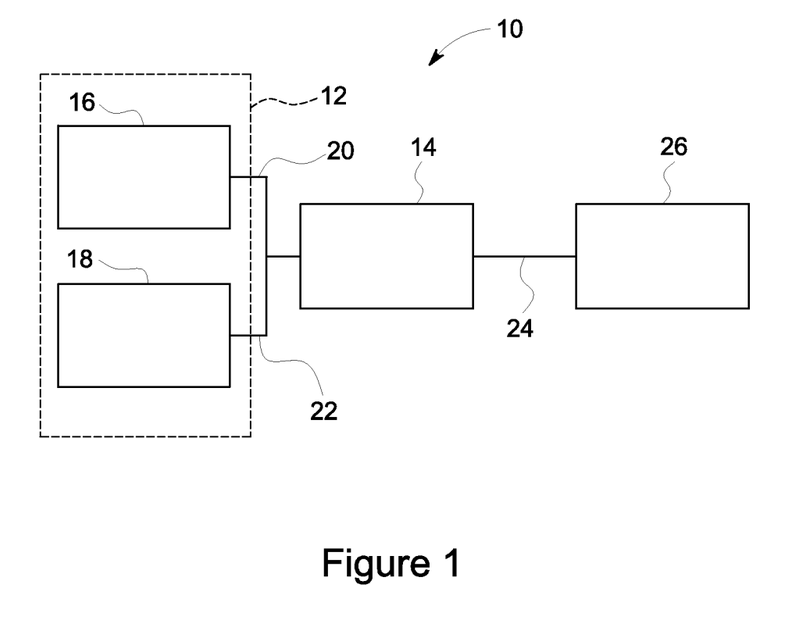
FIG. 1 is a block diagram of an exemplary embodiment of a current measuring system.

FIG. 1 is a block diagram of an exemplary embodiment of a current measuring system 10. Current measuring system 10 is configured to measure a level of current flowing through a conductor (shown in FIG. 2). In the exemplary embodiment, current measuring system 10 includes a magnetic flux sensing device 12 and a processing unit 14. In the exemplary embodiment, magnetic field sensing device 12 includes a first sensor 16 and a second sensor 18. In alternative embodiments, sensing device 12 includes any number of sensors that allow current measuring system 10 to function as described herein. Sensing device 12 is coupled to processing unit 14 and provides processing unit 14 with at least one magnetic flux signal, for example, first flux signal 20 and second flux signal 22. Processing unit 14 processes first flux signal 20 and second flux signal 22 and outputs a current level signal 24. Current level signal 24 may be received by a display device 26 configured to provide a user with an indication of the current flowing through the conductor. For example, display device 26 may include a display screen configured to convert current level signal 24 to a number that may be read by the user. Display device 26 may also include an alarm. Processing unit 14 may be configured to output current level signal 24 only when the corresponding current level is above a predefined threshold. Upon receipt of current level signal 24, the alarm indicates to the user that the measured current is above the predefined threshold. Current level signal 24 may also be provided to a trip device (shown in FIG. 2) of a circuit protection device (shown in FIG. 2).

Figure 2:
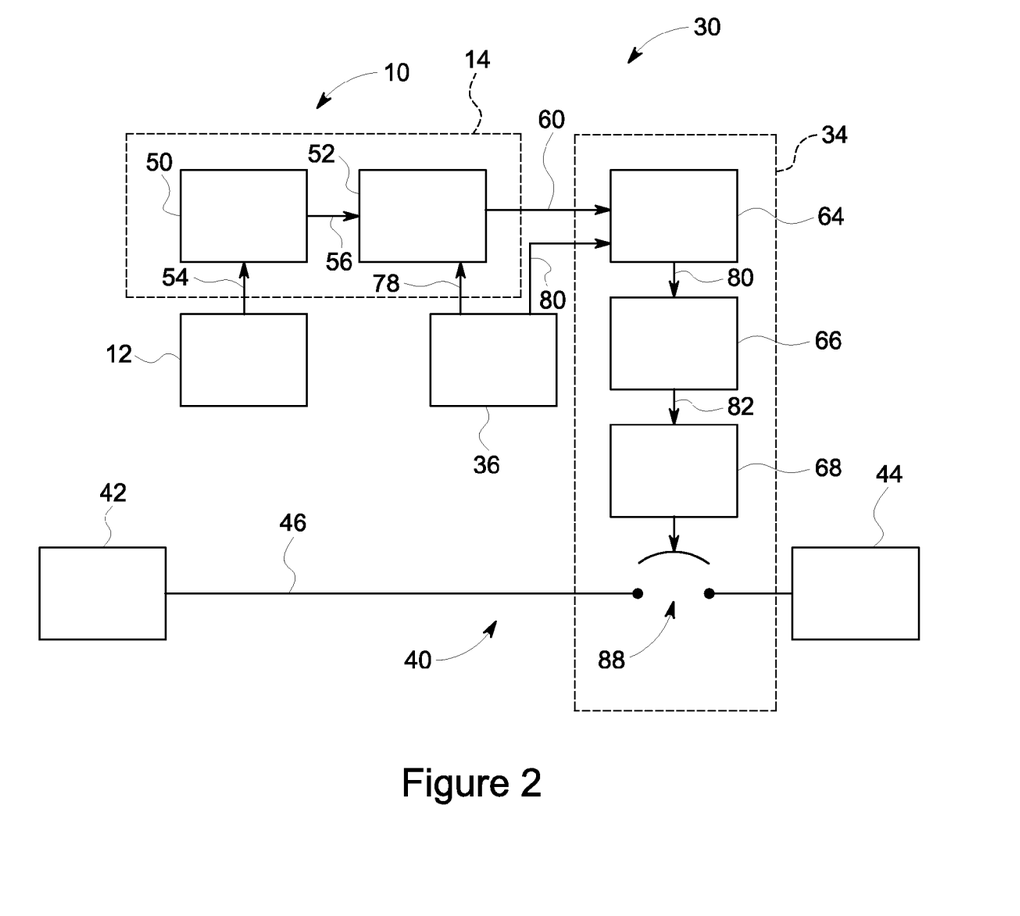
FIG. 2 is block diagram of an exemplary circuit protection device that includes the current measuring system shown in FIG. 1.

FIG. 2 is block diagram of an exemplary embodiment of a circuit protection device 30. A non-limiting example of a circuit protection device is a circuit breaker. However, circuit protection device 30 may be any device configured to protect a circuit from an overcurrent condition as described herein. In the exemplary embodiment, circuit protection device 30 includes current measuring system 10 and a trip device 34. In the exemplary embodiment, processing unit 14 may also be referred to as an electronic trip control unit. Furthermore, although described as included within circuit protection device 30, current measuring system 10 may be included within any system and/or device to measure current flowing through a conductor using measurements of magnetic flux. Such systems and/or devices may include, but are not limited to, motors, motor control systems, and electric vehicles. Circuit protection device 30 may also include a power supply 36. Circuit protection device 30 is included within a circuit 40 that also includes a power source 42 and a load 44 coupled by at least one conductor 46. Circuit protection device 30 protects circuit 40 by opening (i.e., interrupting circuit 40) upon sensing an overcurrent condition. An overcurrent condition is defined herein as the presence of a current level within a conductor that exceeds a predefined threshold current level. For example, processing unit 14 may be configured to determine instantaneous, short time, and/or long time overcurrent conditions, which may be dependent upon a predefined circuit breaker trip curve.

In the exemplary embodiment, processing unit 14 includes signal conditioning circuitry 50 and a processor 52. The term processor, as used herein, refers to central processing units, microprocessors, microcontrollers, reduced instruction set circuits (RISC), application specific integrated circuits (ASIC), logic circuits, and any other circuit or processor capable of executing the functions described herein.

In the exemplary embodiment, sensing device 12 includes a plurality of magnetic flux sensors, for example, but not limited to, Hall effect sensors giant magnetoresistive field sensors, anisotropic magnetoresistive (AMR) sensors, fluxgate/micro-fluxgate sensors, giant magnetoimpedance (GMI) sensors, and/or tunneling magnetoresistance effect (TMR) sensors. Sensing device 12 measures magnetic flux and provides a signal 54 indicative of the measured magnetic flux. Current flowing through conductor 46 generates a magnetic field that emanates from conductor 46. When stray magnetic fields are not present, the magnetic flux measured by sensing device 12 is proportional to an amount of current flowing through conductor 46. Therefore, by measuring the magnetic field surrounding conductor 46, the amount of current flowing through conductor 46 can be determined. For example, signal 54 may include a voltage having a voltage level that is proportional to the measured magnetic flux. Signal conditioning circuitry 50 receives signal 54, conditions signal 54 and outputs a signal 56 to processor 52. For example, signal conditioning circuitry 50 may include an analog to digital converter that receives an analog signal 54 and converts analog signal 54 to a digital signal 56. Processor 52 receives and processes signal 56 to determine the level of current flowing through conductor 46. In the exemplary embodiment, if the level of current flowing through conductor 46 is determined to be higher than a predefined threshold current level, processor 52 generates a current level signal 60 and transmits current level signal 60 to trip device 34. Current level signal 60 may also be referred to herein as a trip signal. The predetermined threshold current is a level of current associated with an overcurrent condition within conductor 46.

In the exemplary embodiment, trip device 34 includes a trip module 64, an actuator 66, and an operating mechanism 68. In the exemplary embodiment, power supply 36 provides an operating voltage 78 to processor 52 and an actuation voltage 80 to trip module 64. Trip module 64 receives current level signal 60 from processor 52 and in response to current level signal 60, provides actuation voltage 80 to actuator 66. Actuator 66 generates and provides an actuation signal 82 to operating mechanism 68, for example, a solenoid, which trips operating mechanism 68. Operating mechanism 68 in turn opens circuit breaker contacts 88. Opening circuit breaker contacts 88 disconnects an electrical connection between power source 42 and load 44 provided by contacts 88 when closed.

As described above, sensing device 12 measures magnetic flux and generates signal 54 indicative of the measured magnetic flux. Sensing device 12 is positioned within circuit 40 such that the magnetic flux measured by sensing device 12 is generated by current flowing through the at least one conductor 46. By positioning sensing device 12 in this manner, the level of magnetic flux measured by sensing device 12 is proportional to an amount of current flowing through the at least one conductor 46. However, sensing device 12 may also be exposed to stray magnetic fields from the surrounding environment. In a specific example, Hall effect sensors do not distinguish between a magnetic field produced by current in conductor 46 and stray magnetic fields. Therefore, stray magnetic fields create noise which may prevent a current measuring system that includes a magnetic field sensor from providing an accurate current measurement. For example, circuit protection device 30 may be included within an application where it is in close proximity to multiple devices that are subject to high in-rush currents and/or short circuit currents. Although these high currents are typically transient, the high currents generate large magnetic fields that may interfere with operation of circuit protection device 30.

More specifically, the magnetic flux measured by sensing device 12 may include magnetic fields generated by other sources (i.e., a stray magnetic field). For example, circuit breaker device 30 may be configured for detecting an overcurrent condition within a first phase of a multi-phase circuit. A multi-phase circuit includes multiple circuit breaker devices 30, each configured to uncouple a load from power source 42 when an overcurrent condition is detected within that phase. However, an overcurrent condition within the first phase may generate substantial magnetic flux in an immediately adjacent phase, resulting in a false indication of an overcurrent condition in the adjacent phase. Therefore, the magnetic flux measured by sensing device 12 may include the magnetic field generated by current flowing through the at least one conductor 46 and a stray magnetic field.

Figure 3:
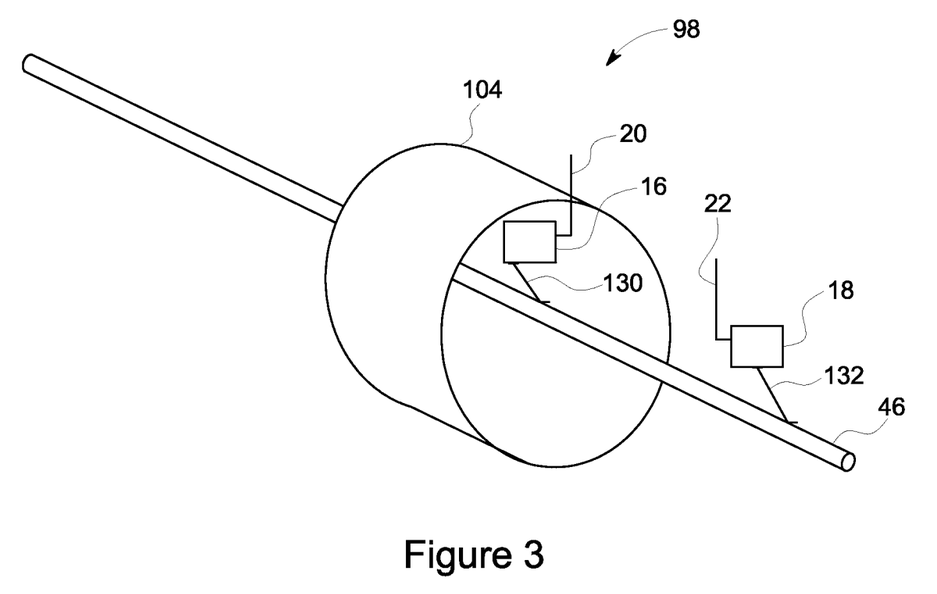
FIG. 3 is a perspective view of an exemplary embodiment of the sensing device shown in FIG. 1.

FIG. 3 is a perspective view of an exemplary embodiment 98 of sensing device 12 (shown in FIG. 1). In the exemplary embodiment, sensing device 98 includes first magnetic field sensor 16 and second magnetic field sensor 18. Although described herein as including two magnetic field sensors, sensing device 98 may include any number of sensors that allows sensing device 98 to function as described herein. In the exemplary embodiment, sensing device 98 also includes a magnetic shielding 104.

In the exemplary embodiment, magnetic shielding 104 is positioned at least partially around first sensor 16. More specifically, magnetic shielding 104 is positioned between first sensor 16 and sources of stray magnetic fields, and therefore, at least partially shields first sensor 16 from stray magnetic fields. In the exemplary embodiment, second sensor 18 is not shielded from stray magnetic fields, and therefore, is more sensitive to stray magnetic fields than first sensor 16. Alternatively, different strengths of magnetic shielding may be provided to shield first sensor 16 and/or second sensor 18. The selected shielding strength facilitates creating the desired sensor sensitivities. Magnetic shielding 104 may vary in thickness, positioning, and/or in material type. In the exemplary embodiment, signal 54 (shown in FIG. 2) includes first output signal 20 from first sensor 16 and second output signal 22 from second sensor 18. For example, first output signal 20 is a voltage level that is proportional to the magnetic flux detected by first sensor 16 and second output signal 22 is a voltage level that is proportional to the magnetic flux detected by second sensor 18. Furthermore, magnetic shielding 104 may concentrate the magnetic field generated by current flowing through the at least one conductor 46 onto first sensor 16.

In the exemplary embodiment, first sensor 16 is configured to have a first sensitivity to a magnetic field generated by current flowing through conductor 46 and second sensor 18 is configured to have a second sensitivity to the magnetic field generated by current flowing through conductor 46. In the exemplary embodiment, the first sensitivity is greater than or equal to the second sensitivity. For example, first sensor 16 is positioned a first distance 130 radially outward from conductor 46 and second sensor 18 is positioned a second distance 132 radially outward from conductor 46. In the exemplary embodiment, first distance 130 is less than or equal to second distance 132. Since magnetic flux dissipates as the distance from conductor 46 increases, first sensor 16 is at least as sensitive to magnetic flux generated by current flowing through conductor 46 as second sensor 18. Thus, for flux generated by current flowing through conductor 46, first output signal 20 of first sensor 16 is equal to or greater than second output signal 22 of second sensor 18.

Processor 52 is configured to determine when a stray magnetic field is present by comparing first output signal 20 and second output signal 22. During typical operating conditions (e.g., no stray magnetic fields or low level of stray magnetic fields), first output signal 20 is equal to or greater than second output signal 22 since first sensor 16 is at least as sensitive to magnetic fields generated by current flowing through conductor 46 as second sensor 18. Therefore, it is an indication that first sensor 16 and second sensor 18 are not subject to stray magnetic fields when first output signal 20 is greater than or equal to second output signal 22. If first output signal 20 is equal to or greater than second output signal 22, and first output signal 20 indicates the presence of an overcurrent condition, processor 52 is configured to output current level signal 60 to trip device 34. For example, if first output signal 20 is greater than or equal to second output signal 22, or if first sensor 16 is saturated, first output signal 20 is determined to be real and accumulated, and if first output signal 20 corresponds to a current level that is greater than the predefined overcurrent threshold, processor 52 generates current level signal 60 and trip device 34 is tripped.

However, it is an indication that first sensor 16 and second sensor 18 are subject to stray magnetic fields when second output signal 22 is greater than first output signal 20. This is due to second sensor 18 having a higher sensitivity to stray magnetic fields compared to first sensor 16. In the exemplary embodiment, processor 52 determines that a stray magnetic field is present if second output signal 22 is greater than first output signal 20. In the exemplary embodiment, processor 52 is configured to ignore first output signal 20 when a stray magnetic field is present. For example, if second output signal 22 is greater than first output signal 20, even if first output signal 20 is indicative of an overcurrent condition, processor 52 ignores first output signal 20 and does not provide current level signal 60 to trip device 34. By ignoring first output signal 20 when stray magnetic fields are determined to be present, a nuisance tripping of trip device 34 is avoided, since first output signal 20 is high due to stray magnetic fields and not due to an overcurrent condition within conductor 46.

In a first alternative embodiment, if second output signal 22 is greater than first output signal 20 (i.e., a stray magnetic field is present), processor 52 determines a portion of the magnetic flux measured by first sensor 16 attributable to the stray magnetic field. Processor 52 then determines the actual current flowing through conductor 46 and outputs current level signal 60 if the actual current flowing through conductor 46 is higher than the predefined overcurrent threshold. Processor 52 may adjust first output signal 20 based on the portion of the magnetic flux caused by stray magnetic fields. First output signal 20 may be reduced by an amount determined based on, for example, a difference between second output signal 22 and first output signal 20, a difference between distance 130 and distance 132, and/or a shielding level provided by magnetic shielding 104.

An ideal output of second sensor 18 may be determined based on first output signal 20, for example, by using a stored look-up table or stored calculations. In a specific embodiment, an adjusted first output signal may be determined by: adjusted primary sensor value=first output signal 20—(ideal output of second sensor 18—second output signal 22)*(scaling factor), wherein the scaling factor may be used to adjust for different orientations of first sensor 16 and second sensor 18. Adjusting first output signal 20 to compensate for stray magnetic fields facilitates compensating not only for transient stray magnetic fields, but also for non-transient stray magnetic fields. In another example, first output signal 20 and second output signal 22 are averaged, and the average output signal is used to identify an overcurrent condition. Errors in long time overcurrent condition and short time overcurrent condition calculations caused by a persistent stray magnetic field are avoided by continuously adjusting the first output signal.

In a second alternative embodiment, if second output signal 22 is greater than first output signal 20, processor 52 determines a portion of the magnetic flux measured by first sensor 16 attributable to the stray magnetic field and adjusts the predefined threshold overcurrent value to compensate for the portion of the magnetic flux attributable to the stray magnetic field. For example, processor 52 may increase the threshold overcurrent value when a stray magnetic field is detected.

In a third alternative embodiment, if second output signal 22 is greater than first output signal 20, processor 52 limits the accumulation of first sensor 16 so that circuit protection device 30 will not trip when second output signal 22 identifies a strong stray field. For example, processor 52 is allowed to receive and process data from first sensor 16, but accumulators are not allowed to exceed a trip threshold. More specifically, the accumulator may be limited to, for example, 80% to 90% of the trip threshold when the second output signal 22 corresponds to the presence of a stray magnetic field. By limiting the accumulator, circuit protection device 30 will not trip, but the rising accumulator is not completely ignored. Once the stray magnetic field dissipates, if the fault current is above the current threshold, the accumulator will be close to the tripping threshold, resulting in a more rapid response to the conditions. Once the stray magnetic field dissipates, if the fault current is below the current threshold, the accumulator will decrement due to the low current levels.

The percentage of the trip threshold that the accumulator is limited to may be a predetermined fixed value. The percentage may also be inversely proportional to a strength of the magnetic field measured by second sensor 18, such that a stronger field measured by second sensor 18 will have a greater impact on the accumulator than a weaker field. Furthermore, the percentage of the trip threshold that the accumulator is limited to may also be stored in a table that includes percentages derived from experimentation that characterize optimal limits. Moreover, any suitable method of calculating an accumulator limit percentage may be used that allows trip device 34 to function as described herein.

Figure 4:
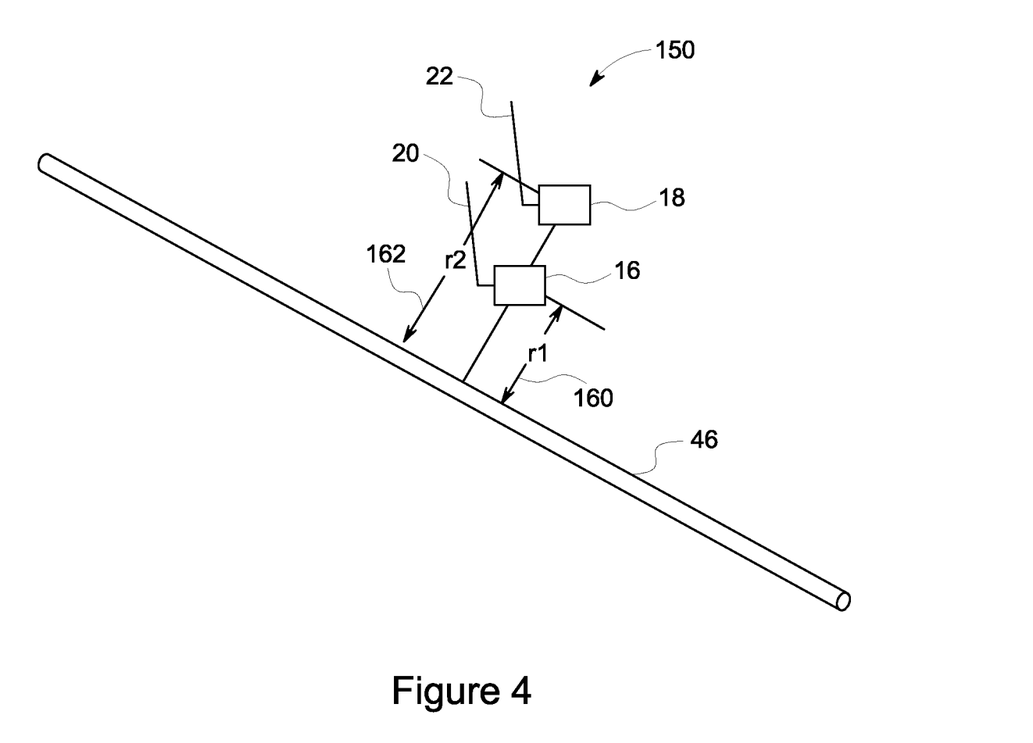
FIG. 4 is a perspective view of a first alternative embodiment of the sensing device shown in FIG. 1.

FIG. 4 is a perspective view of an alternative embodiment 150 of sensing device 12 (shown in FIG. 1). Sensing device 150 also includes first sensor 16 and second sensor 18. In the alternative embodiment, first sensor 16 is less sensitive to stray magnetic fields than second sensor 18 because first sensor 16 is positioned farther from sources of stray magnetic fields than second sensor 18. First sensor 16 is positioned a first radial distance 160 from conductor 46 and second sensor 18 is positioned a second, larger radial distance 162 from conductor 46. Accordingly, second sensor 18 is more sensitive to stray magnetic fields than first sensor 16 since second sensor 18 is positioned closer to sources of stray magnetic fields than is first sensor 16. As described above with respect to sensing device 98, processor 52 determines a portion of the magnetic flux measured by sensing device 150 that is generated by stray magnetic fields, and the portion of the magnetic flux measured by sensing device 150 that is generated by current flowing through conductor 46.

Figure 5:
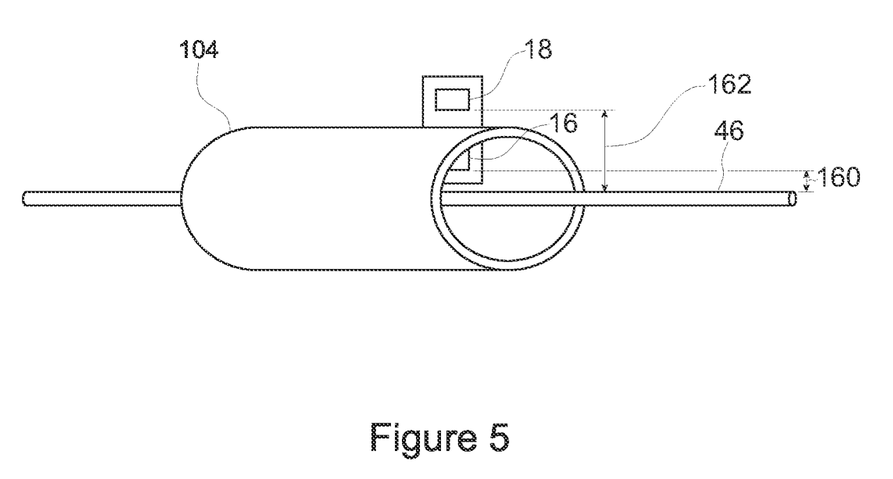
FIG. 5 is a perspective view of a second alternative embodiment of the sensing device shown in FIG. 1.

FIG. 5 is a perspective view of a second alternative embodiment 164 of sensing device 12 (shown in FIG. 1). Components shared between first alternative embodiment 150 and second alternative embodiment 164 of sensing device 12 are identified with identical reference numerals. First sensor 16 is positioned first radial distance 160 from conductor 46 and second sensor 18 is positioned second radial distance 162 from conductor 46. In the second alternative embodiment, sensing device 164 includes magnetic shielding 104 positioned at least partially around first sensor 16. More specifically, magnetic shielding 104 is positioned between first sensor 16 and sources of stray magnetic fields, and therefore, at least partially shields first sensor 16 from stray magnetic fields. Second sensor 18 is not shielded from stray magnetic fields, and therefore, is more sensitive to stray magnetic fields than first sensor 16. Furthermore, second sensor 18 is also more sensitive to stray magnetic fields than first sensor 16 because second sensor 18 is a greater distance from conductor 46, and closer to sources of stray magnetic fields.

Figure 6:
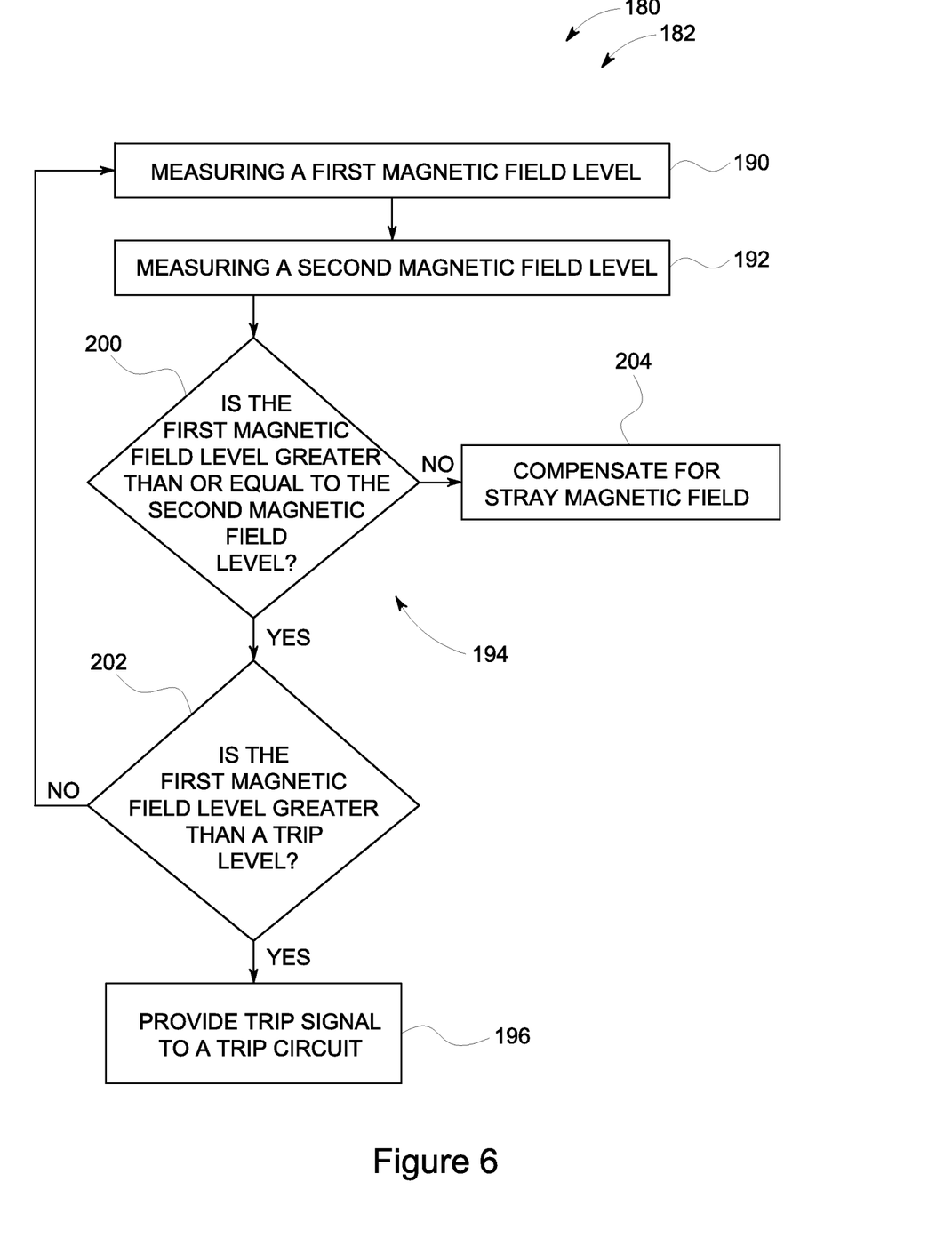
FIG. 6 is a flow chart of an exemplary method for determining a current through a conductor.

FIG. 6 is a flow chart 180 of an exemplary method 182 for operating a circuit protection device, for example, circuit protection device 30 (shown in FIG. 2). In the exemplary embodiment, method 182 includes measuring 190 a first magnetic flux using a first sensor, for example, first sensor 16 (shown in FIG. 3). Method 182 also includes measuring 192 a second magnetic flux using a second sensor, for example, second sensor 18 (shown in FIG. 3). As described above, second sensor 18 is more sensitive to stray magnetic fields than first sensor 16. Method 182 also includes comparing 194 the first magnetic flux and the second magnetic flux and providing 196 a trip signal based at least partially on the comparison of the first magnetic flux and the second magnetic flux. For example, processor 52 (shown in FIG. 2) is configured to compare 194 the first magnetic flux measured by first sensor 16 to the second magnetic flux measured by second sensor 18.

More specifically, comparing 194 includes determining 200 if the first magnetic flux is greater than or equal to the second magnetic flux. Furthermore, if it is determined 200 that the first magnetic flux is greater than or equal to the second magnetic flux, comparing 194 also includes determining 202 if the first magnetic flux is greater than a predefined current level threshold. The predefined current level threshold is a magnetic flux that corresponds to an overcurrent condition in conductor 46. If it is determined 202 that the first magnetic flux is greater than the predefined current level threshold, processor 52 generates trip signal 60 and provides

196 it to trip device 34. Trip device 34 is configured to trip operating mechanism 68 (shown in FIG. 2) in response to trip signal 60.

If it is determined 200 that the first magnetic flux is not greater than or equal to the second magnetic flux, method 182 also includes compensating 204 for stray magnetic fields. As described above, since second sensor 18 is more sensitive to stray magnetic fields when compared with first sensor 16, a stray magnetic field is present if the second magnetic flux is greater than the first magnetic flux. For example, when a short circuit occurs near circuit protection device 30, stray magnetic fields are created, which are sensed to a greater extent by second sensor 18 than by first sensor 16. This is due to first sensor 16 being shielded from stray magnetic fields (shown in FIG. 3) and/or first sensor 16 being positioned farther from sources of stray magnetic fields than second sensor 18 (shown in FIG. 4).

Using this information, processor 52 compensates 204 for stray magnetic fields, which reduces nuisance tripping of the circuit breaker. Compensating 204 may include ignoring the first magnetic flux during a transient event, limiting accumulation of first sensor 16 so trip circuit 34 does not trip during a transient event, and/or determining a portion of the magnetic flux measured by first sensor 16 attributable to stray magnetic fields and determining the actual current through conductor 46 by subtracting the effect of the stray magnetic fields from the total magnetic flux measured by first sensor 16. Processor 52 may be configured to apply transfer functions to determine actual current through conductor 46, and/or to correct the first magnetic flux to eliminate contributions from stray magnetic fields, based on first signal 20 from first sensor 16 and second signal 22 from second sensor 18.

Figure 7:
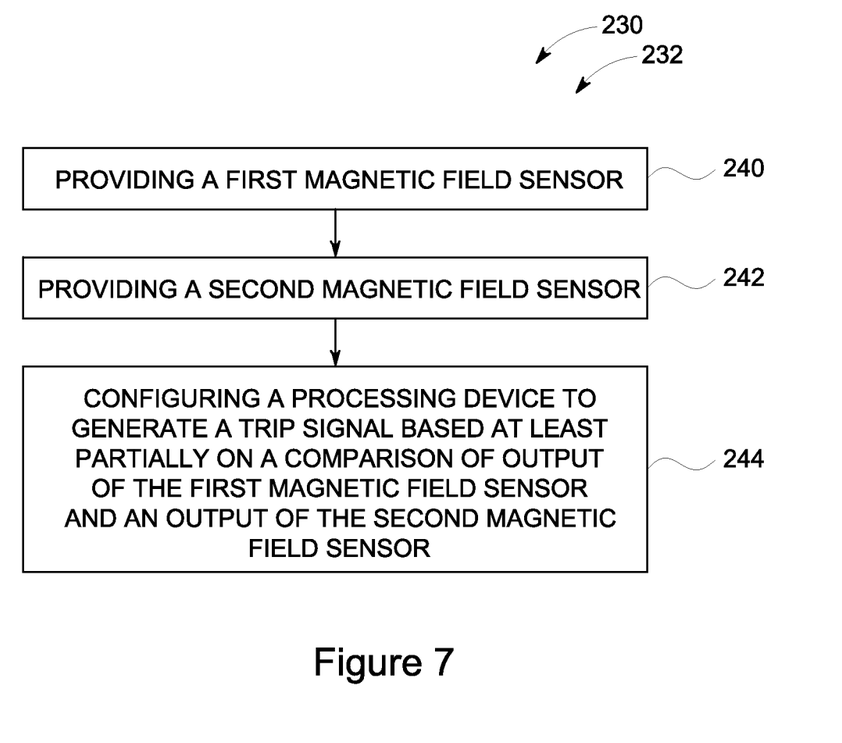
FIG. 7 is a flow chart of an exemplary method for assembling the circuit protection device shown in FIG. 2.

FIG. 7 is a flow chart 230 of an exemplary method 232 for assembling circuit protection device 30 (shown in FIG. 2). In the exemplary embodiment, method 232 includes providing 240 a first magnetic field sensor, for example, first magnetic field sensor 16 (shown in FIG. 3), for measuring a first magnetic flux. Method 232 also includes providing 242 a second magnetic field sensor, for example, second magnetic field sensor 18 (shown in FIG. 3) for measuring a second magnetic flux. Second magnetic field sensor 18 has a higher sensitivity to stray magnetic fields than first magnetic field sensor 16. In the exemplary embodiment, method 232 also includes positioning magnetic shielding, for example, magnetic shielding 104 (shown in FIG. 3) at least partially around first magnetic field sensor 16. Magnetic shielding 104 reduces the stray magnetic fields measured by first magnetic field sensor 16. By positioning magnetic shielding 104 between first magnetic field sensor 16 and sources of stray magnetic fields, and not between second magnetic field sensor 18 and sources of stray magnetic fields, a sensitivity to stray magnetic fields of first magnetic field sensor 16 is reduced when compared to the sensitivity to stray magnetic fields of second magnetic field sensor 18.

In an alternative embodiment, providing 240 first magnetic field sensor 16 and providing 242 second magnetic field sensor 18 includes positioning first magnetic field sensor 16 a first distance, for example, first distance 160 (shown in FIG. 4), from conductor 46 and second magnetic field sensor 18 a second distance, for example, second distance 162 (shown in FIG. 4), from conductor 46, wherein second distance 162 is greater than first distance 160. By positioning second magnetic field sensor 18 farther from conductor 46, and closer to sources of stray magnetic fields, stray magnetic fields have a greater effect on second magnetic field sensor 18 than they have on first magnetic field sensor 16.

In the exemplary embodiment, method 232 also includes configuring 244 a processing device, for example, processor 52 (shown in FIG. 2) to generate a trip signal, for example, current level signal 60 (shown in FIG. 2). Trip signal 60 is based at least partially on a comparison of the first magnetic flux and the second magnetic flux. Trip signal 60 may also be based on at least one of the first magnetic flux and the second magnetic flux.

Method 232 may also include configuring processor 52 to provide trip signal 60 to a trip device, for example, trip device 34 (shown in FIG. 2), wherein trip device 34 is configured to disconnect a load, for example load 44 (shown in FIG. 2) from a power source, for example, power source 42 (shown in FIG. 2) in response to trip signal 60. For example, processor 52 provides trip signal 60 when the first magnetic flux is greater than or equal to the second magnetic flux and greater than or equal to a predefined overcurrent threshold. Configuring processor 52 to provide trip signal 60 to trip device 34 further comprises configuring processor 52 to determine an actual current level within conductor 46. The actual current level is determined by reducing the first magnetic flux by an amount associated with the stray magnetic flux measured by second magnetic field sensor 18.

Described herein are exemplary methods, systems, and apparatus for measuring current. More specifically, the methods, systems, and apparatus described herein facilitate determining a portion of a measured magnetic flux caused by a stray magnetic field and a portion of the measured magnetic flux generated by current flowing through a conductor. For example, multiple circuit breakers, when placed in close proximity, may not be separated by a space large enough to include a magnetic shield able to block all stray magnetic fields from reaching a magnetic field sensor. Instead, compensation is made for the portion of the measured magnetic flux caused by stray magnetic fields, which reduces nuisance tripping of the circuit protection device. The methods, systems, and apparatus described herein allow for close spacing between multiple circuit protection devices, which facilitates manufacture and operation of a compact circuit breaker box. Furthermore, the methods, systems, and apparatus described herein overcome a noise immunity problem of a Hall effect sensor. Without a solution to noise immunity, Hall effect sensors cannot be used with electronic trip units because a circuit breaker likely would nuisance trip if an adjacent device experienced in-rush or short circuit current.

The methods, systems, and apparatus described herein use two or more Hall effect sensors to determine the presence of stray magnetic fields and to prevent a circuit protection device from responding to the stray magnetic fields. A primary sensor is less sensitive to stray magnetic fields than a secondary sensor. Therefore, during normal operation, where the primary sensor is monitoring current through a conductor, the primary sensor output will be greater than or equal to the secondary sensor output. A stray magnetic field is determined to be present when the secondary sensor output is greater than the primary sensor output.

The methods, systems, and apparatus described herein facilitate efficient and economical measuring of current. Exemplary embodiments of methods, systems, and apparatus are described and/or illustrated herein in detail. The methods and systems are not limited to the specific embodiments described herein, but rather, components of each system, as well as steps of each method, may be utilized independently and separately from other components and steps described herein. Each component, and each method step, can also be used in combination with other components and/or method steps.

When introducing elements/components/etc. of the methods, systems, and apparatus described and/or illustrated herein, the articles "a", "an", "the", and "said" are intended to mean that there are one or more of the element(s)/component(s)/etc. The terms "comprising", "including", and "having" are intended to be inclusive and mean that there may be additional element(s)/component(s)/etc. other than the listed element(s)/component(s)/etc.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A current measuring system for measuring a current through a conductor, said system comprising:
   a first sensor configured to measure a first magnetic flux and to generate a first signal proportional to the first magnetic flux;
   a second sensor configured to measure a second magnetic flux and to provide a second signal proportional to the second magnetic flux, said second sensor having a higher sensitivity to stray magnetic fields than said first sensor; and
   a processor coupled to said first sensor and said second sensor and configured to receive the first signal and the second signal, said processor further configured to:
      determine a presence of a stray magnetic field by comparing the first signal and the second signal; and
      output a current level signal comprising a trip signal when the first signal is greater than both the second signal and a predefined overcurrent level.

2. A system in accordance with claim 1 wherein said first sensor comprises at least one of a Hall effect sensor and a giant magnetoresistive field sensor.

3. A system in accordance with claim 1 wherein said first sensor is positioned a first distance from the conductor and said second sensor is positioned a second distance from the conductor, wherein the second distance is greater than the first distance.

4. A system in accordance with claim 1 further comprising magnetic shielding positioned at least partially around said first sensor, said magnetic shielding configured to protect said first sensor from stray magnetic fields.

5. A system in accordance with claim 1 wherein the current level signal is based on a weighted average of the first signal and the second signal.

6. A circuit protection device positioned between a power source and a load, wherein at least one conductor couples the power source to the load, said device comprising:
   a first sensor configured to measure a first magnetic flux and to provide a first signal proportional to the first magnetic flux;
   a second sensor configured to measure a second magnetic flux and to provide a second signal proportional to the second magnetic flux, said second sensor having a higher sensitivity to stray magnetic fields than said first sensor;
   a processor coupled to said first sensor and said second sensor and configured to receive the first signal and the second signal, said processor further configured to compare the first signal and the second signal to determine a presence of a stray magnetic field, said processor further configured to generate a trip signal; and
   a trip device coupled to said processor and configured to disconnect the power source and from the load in response to the trip signal, wherein said processor is configured to output the trip signal to said trip device when the second signal is less than the first signal and the first signal corresponds to a magnetic field level that is greater than or equal to a threshold overcurrent value.

7. A device in accordance with claim 6 wherein said processor is configured to output the trip signal when a weighted average of the first signal and the second signal indicates the presence of an overcurrent condition.

8. A device in accordance with claim 6 wherein said processor, when the second signal is greater than the first signal, is configured to at least one of:
   disregard the first signal;
   determine a portion of the first magnetic flux caused by stray magnetic fields;
   determine the actual current flowing through the at least one conductor by adjusting the first signal based on the portion of the first magnetic flux caused by stray magnetic fields; and
   adjust the threshold overcurrent value to compensate for the portion of the first magnetic flux caused by stray magnetic fields.

9. A device in accordance with claim 6 wherein said first sensor is positioned a first distance from the at least one conductor and said second sensor is positioned a second distance from the at least one conductor, wherein the second distance is greater than the first distance.

10. A device in accordance with claim 6 further comprising magnetic shielding positioned at least partially around said first sensor, said magnetic shielding configured to protect said first sensor from stray magnetic fields.

* * * * *